US 12,207,490 B2

(12) United States Patent
Zhang et al.

(10) Patent No.: US 12,207,490 B2
(45) Date of Patent: Jan. 21, 2025

(54) METHOD FOR TREATING TRANSPARENT ADHESIVE LAYER OF PROTECTIVE FILM ON DISPLAY BACK PLATE OF DISPLAY PANEL

(71) Applicants: Chengdu BOE Optoelectronics Technology Co., Ltd., Sichuan (CN); BOE Technology Group Co., Ltd., Beijing (CN)

(72) Inventors: Mingjiong Zhang, Beijing (CN); Taofeng Xie, Beijing (CN); Hao Yan, Beijing (CN); Zeyu Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 329 days.

(21) Appl. No.: 17/568,446

(22) Filed: Jan. 4, 2022

(65) Prior Publication Data
US 2022/0320462 A1    Oct. 6, 2022

(30) Foreign Application Priority Data
Mar. 31, 2021    (CN) .......................... 202110349185.7

(51) Int. Cl.
*H10K 50/842*    (2023.01)
*B32B 7/06*    (2019.01)
(Continued)

(52) U.S. Cl.
CPC ........... *H10K 50/8426* (2023.02); *B32B 7/06* (2013.01); *B32B 27/20* (2013.01); *B32B 27/281* (2013.01);
(Continued)

(58) Field of Classification Search
CPC ............. H10K 59/873; H10K 50/8426; H10K 59/131; H10K 71/00; H10K 2102/311;
(Continued)

(56) References Cited

U.S. PATENT DOCUMENTS

| 10,637,000 | B2* | 4/2020 | Kim | ......................... B32B 7/06 |
| 11,793,107 | B2* | 10/2023 | Talit | ......................... A01C 7/02 |
| 2011/0043981 | A1* | 2/2011 | Johnson | ............ G02F 1/133308 |
| | | | | 361/679.01 |

(Continued)

FOREIGN PATENT DOCUMENTS

| JP | 2011053582 A | 3/2011 |
| KR | 20180037088 A | 4/2018 |
| WO | 2019049726 A1 | 3/2019 |

OTHER PUBLICATIONS

CN202110349185.7 Notification to grant patent for invention dated Mar. 5, 2024.

*Primary Examiner* — Alonzo Chambliss
(74) *Attorney, Agent, or Firm* — IPro, PLLC

(57) ABSTRACT

Disclosed is a method for manufacturing a display panel. The method includes: providing a display back plate, wherein the display back plate is provided with a light emitting side; attaching a protective film on the light emitting side of the display back plate, wherein the protective film comprises a transparent adhesive layer disposed on the display back plate and a heavy release film disposed on a side, distal from the display back plate, of the transparent adhesive layer; treating the transparent adhesive layer; and removing the heavy release film, and attaching a functional layer on a side, distal from the display back plate, of the transparent adhesive layer.

14 Claims, 3 Drawing Sheets

(51) Int. Cl.
- *B32B 27/20* (2006.01)
- *B32B 27/28* (2006.01)
- *H01L 21/683* (2006.01)
- *H01L 27/12* (2006.01)
- *H10K 50/844* (2023.01)
- *H10K 59/131* (2023.01)
- *H10K 59/80* (2023.01)
- *H10K 71/00* (2023.01)
- *H10K 59/12* (2023.01)
- *H10K 102/00* (2023.01)

(52) U.S. Cl.
CPC ...... *H01L 21/6836* (2013.01); *H01L 27/1266* (2013.01); *H10K 50/844* (2023.02); *H10K 59/131* (2023.02); *H10K 59/873* (2023.02); *H10K 59/8794* (2023.02); *H10K 71/00* (2023.02); *H10K 59/1201* (2023.02); *H10K 2102/311* (2023.02)

(58) Field of Classification Search
CPC ........... H10K 59/8794; H10K 50/8794; H10K 50/844; H10K 57/8722; H01L 27/1266; H01L 21/6835; H01L 27/32; H01L 21/6836; B32B 7/06; B32B 27/281; B32B 27/20

See application file for complete search history.

(56) References Cited

U.S. PATENT DOCUMENTS

| | | | |
|---|---|---|---|
| 2013/0249877 A1* | 9/2013 | Choi | H01L 27/1248 345/205 |
| 2014/0117342 A1* | 5/2014 | Kwon | H10K 77/111 257/40 |
| 2015/0053943 A1* | 2/2015 | Cho | H10K 59/40 438/26 |
| 2021/0027667 A1 | 1/2021 | Lee et al. | |
| 2023/0080831 A1* | 3/2023 | Liao | G06F 1/1637 257/91 |

* cited by examiner

METHOD FOR TREATING TRANSPARENT ADHESIVE LAYER OF PROTECTIVE FILM ON DISPLAY BACK PLATE OF DISPLAY PANEL

CROSS-REFERENCE TO RELATED APPLICATION

This application is based on and claims priority to the Chinese Patent Application No. 202110349185.7, filed on Mar. 31, 2021 and entitled "DISPLAY PANEL, AND METHOD FOR MANUFACTURING SAME," the disclosure of which is herein incorporated by reference in its entirety.

TECHNICAL FIELD

The present disclosure relates to the field of display technologies, and in particular, relates to a display panel, a method for manufacturing the same, and a display device.

BACKGROUND

A temporary protective film (TPF) is required in the process of manufacturing a display panel, and the temporary protective film needs to be removed in the subsequent processes. For example, in the process of manufacturing an organic light-emitting diode (OLED) display panel, in the case that a thin film encapsulation layer or a touch functional layer of the OLED display panel has been prepared, the temporary protective film needs to be attached to the thin film encapsulation layer or the touch functional layer, followed by dicing, point light testing, grading, or the like. In the subsequent module process, the temporary protective film needs to be released to further attach other functional layers by an optical clear adhesive (OCA).

SUMMARY

Embodiments of the present disclosure are intended to overcome the above deficiencies of the related art, and provide a display panel, a method for manufacturing the same, and a display device, which reduces the cost of the display panel.

According to one aspect of the embodiments of the present disclosure, a method for manufacturing a display panel is provided.

The method includes: providing a display back plate, wherein the display back plate is provided with a light emitting side; attaching a protective film on the light emitting side of the display back plate, wherein the protective film includes a transparent adhesive layer disposed on the display back plate and a heavy release film disposed on a side, distal from the display back plate, of the transparent adhesive layer; wherein a release force between the transparent adhesive layer and the display back plate is a first release force, a release force between the transparent adhesive layer and the heavy release film is a second release force, and the first release force is less than the second release force; treating the transparent adhesive layer such that the release force between the transparent adhesive layer and the display back plate is increased to a third release force, wherein the third release force is greater than the second release force; removing the heavy release film, and attaching a functional layer on a side, distal from the display back plate, of the transparent adhesive layer.

In some embodiments, attaching the protective film on the light emitting side of the display back plate includes: providing a temporary protective film, wherein the temporary protective film includes a light release film, the transparent adhesive layer, and the heavy release film that are successively laminated, a release force between the light release film and the transparent adhesive layer being a fourth release force, the fourth release force being greater than the first release force; removing the light release film in the temporary protective film to obtain the protective film; attaching the transparent adhesive layer in the protective film on the light emitting side of the display back plate.

In some embodiments, the fourth peel force is no more than 5 gf/25 mm.

In some embodiments, the light release film includes a polyethylene terephthalate film.

In some embodiments, the first peel force ranges from 0.8 gf/25 mm to 2 gf/25 mm.

In some embodiments, the second peel force ranges from 10 gf/25 mm to 20 gf/25 mm.

In some embodiments, the third peel force is no less than 400 gf/25 mm.

In some embodiments, processing the transparent glue layer includes:
irradiating the transparent adhesive layer with ultraviolet light.

In some embodiments, a material of the transparent adhesive layer includes at least one of polymethyl methacrylate, polyimide, epoxy, or polyurethane.

In some embodiments, the heavy release film includes a polyethylene terephthalate film.

In some embodiments, the display back plate includes a base substrate, a drive circuit layer, a pixel layer, and a thin film encapsulation layer that are successively laminated; and attaching the protective film on the light emitting side of the display back plate includes: attaching the protective film on a surface, distal from the base substrate, of the thin film encapsulation layer.

In some embodiments, the display back plate includes a base substrate, a drive circuit layer, a pixel layer, a thin film encapsulation layer, and a touch functional layer that are successively laminated; and attaching the protective film on the light emitting side of the display back plate includes: attaching the protective film on a surface, distal from the base substrate, of the touch functional layer.

In some embodiments, the functional layer is one of a de-reflectivity layer or a transparent protective layer.

In some embodiments, upon attaching the protective film on the light emitting side of the display back plate, and prior to treating the transparent adhesive layer, the method further includes: testing the display back plate attached with the protective film.

According to another aspect of the embodiments of the present disclosure, a display panel is provided. The display panel includes a display back plate, a transparent adhesive layer, and a functional layer that are successively laminated.

The display panel is manufactured by: providing the display back plate, wherein the display back plate is provided with a light emitting side; attaching a protective film on the light emitting side of the display back plate, wherein the protective film includes the transparent adhesive layer disposed on the display back plate and a heavy release film disposed on a side, distal from the display back plate, of the transparent adhesive layer; wherein a release force between the transparent adhesive layer and the display back plate is a first release force, a release force between the transparent adhesive layer and the heavy release film is a second release force, and the first release force is less than the second release force; treating the transparent adhesive layer such that the release force between the transparent adhesive layer and the display back plate is increased to a third release force, wherein the third release force is greater than the second release force; and removing the heavy release film, and attaching the functional layer on a side, distal from the display back plate, of the transparent adhesive layer.

In some embodiments, the release force between the display back panel and the transparent adhesive layer is not less than 400 gf/25 mm.

In some embodiments, a material of the transparent adhesive layer includes at least one of polymethyl methacrylate, polyimide, epoxy, or polyurethane.

In some embodiments, the transparent adhesive layer is irradiated by ultraviolet light.

According to still another aspect of the embodiments of the present disclosure, a display device is provided. The display device includes a display panel and a power supply configured to supply power to the display panel.

The display panel is manufactured by: providing a display back plate, wherein the display back plate is provided with a light emitting side; attaching a protective film on the light emitting side of the display back plate, wherein the protective film includes a transparent adhesive layer disposed on the display back plate and a heavy release film disposed on a side, distal from the display back plate, of the transparent adhesive layer; wherein a release force between the transparent adhesive layer and the display back plate is a first release force, a release force between the transparent adhesive layer and the heavy release film is a second release force, and the first release force is less than the second release force; treating the transparent adhesive layer such that the release force between the transparent adhesive layer and the display back plate is increased to a third release force, wherein the third release force is greater than the second release force; and removing the heavy release film, and attaching a functional layer on a side, distal from the display back plate, of the transparent adhesive layer.

In some embodiments, the release force between the display back plate and the transparent adhesive layer is not less than 400 gf/25 mm.

It should be understood that both the foregoing general description and the following detailed description are exemplary and explanatory only, and are not intended to limit the present disclosure.

Figure 1:
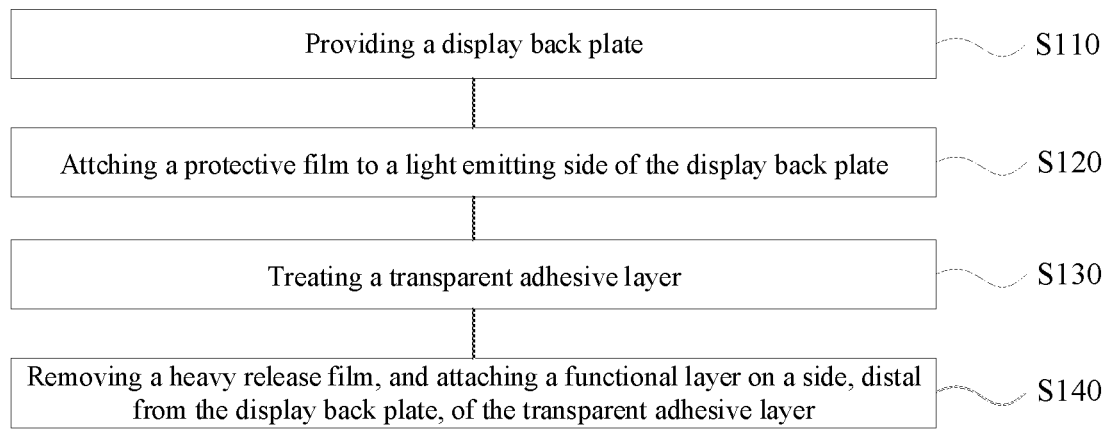
FIG. 1 is a flowchart of a method for manufacturing a display panel according to an embodiment of the present disclosure.

Reference numerals and denotations thereof:
101—transparent adhesive layer; 102—heavy release film; 103—light release film; 200—display back plate; 300—functional layer; F100—base substrate; F200—drive circuit layer; F200M—transistor; F201—barrier layer; F202—buffer layer; F203—semiconductor layer; F204—gate insulating layer; F205—gate layer; F206—interlayer dielectric layer; F207—source drain metal layer; F208—planarization layer; F300—pixel layer; F301—pixel electrode layer; F302—pixel definition layer; F303—support pillar layer; F304—organic light emitting functional layer; F305—common electrode layer; F400—thin film encapsulation layer; F401—first inorganic encapsulation layer; F402—organic encapsulation layer; F403—second inorganic encapsulation layer; F500—touch functional layer.

DETAILED DESCRIPTION

Exemplary implementations are hereinafter described more fully with reference to the accompanying drawings. However, the exemplary implementations may be implemented in various forms, and shall not be constructed as limited to the implementations set forth herein. On the contrary, provision of these implementations may enable the present disclosure to be more comprehensive and complete, and thereby conveying the concept of the exemplary implementations to those skilled in the art. The same reference signs in the drawings may indicate the same or similar structures, and thus their detailed descriptions are omitted. Furthermore, the accompanying drawings are merely schematic illustrations of the present disclosure, and are not necessarily drawn to scale.

Although relative terms such as "up" and "down" are adopted in this specification to describe the relative relationship of one component to another represented by a reference sign, these terms are adopted in this specification only for convenience, for example, based on the direction of the example described in the accompanying drawings. It can be understood that if the device shown by the reference sign is flipped to make it upside down, the component described as being "up" may become the component described as being "down." In the case that a structure is "on" other structures, it may mean that a structure is integrally formed on other structures, or that a structure is "directly" provided on other structures, or that a structure is "indirectly" provided on other structures via another structure.

The terms "a," "one," and "the" are adopted to indicate the existence of one or more elements, components or the like; and the terms "include" and "comprise" are adopted to indicate open-ended inclusion and to mean that additional elements, components or the like may exist besides the listed elements, components or the like. The terms "first" and "second" and the like are used merely as labels, and are not intended to limit the number of objects.

The cost of the temporary protective film is relatively high, which increases the production cost of the display panel.

In some embodiments, a unit of a release force between two film layers are gf/25 mm, gf/25 mm represents the grams (g) of force sustained per 25 mm length, wherein f represents the force, gf represents the grams-force, that is, the gravity force experienced by 1 g of the object. In the present disclosure, the release force is a release force measured at a peel angle of 180° according to the test method shown in the National Standard GB/T2792-2014.

The present disclosure provides a method for manufacturing a display panel, and FIG. 1 is a flowchart of a method for manufacturing a display panel according to an embodiment of the present disclosure. As shown in FIG. 1, the method for manufacturing the display panel includes the following processes S110 to S140.

In S110, a display back plate is provided.

Figure 2:
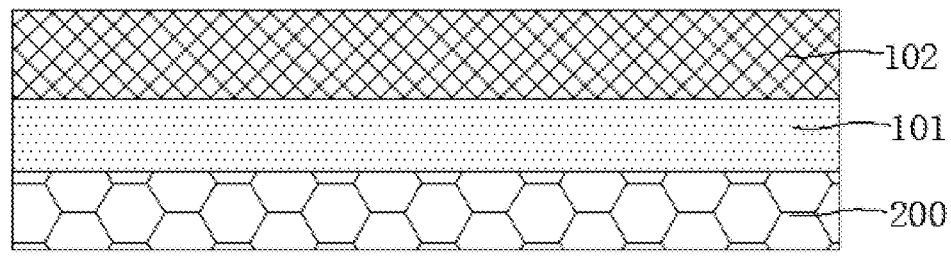
FIG. 2 is a schematic structural diagram of a display panel attached with a protective film according to an embodiment of the present disclosure.

FIG. 2 is a schematic structural diagram of a display panel attached with a protective film according to an embodiment of the present disclosure. Referring to FIG. 2, the display back plate 200 is provided, the display back plate 200 is provided with a light emitting side. The display back plate 200 is an intermediate product of the displays panel.

In S120, a protective film is attached to a light emitting side of the display back plate.

Referring to FIG. 2, the protective film includes a transparent adhesive layer 101 disposed on the display back plate 200 and a heavy release film 102 disposed on a side, distal from the display back plate 200, of the transparent adhesive layer 101. A release force between the transparent adhesive layer 101 and the display back plate 200 is a first release force, a release force between the transparent adhesive layer 101 and the heavy release film 102 is a second release force, and the first release force is less than the second release force.

In S130, a transparent adhesive layer is treated.

In some embodiments, in response to treating the transparent adhesive layer, the release force between the transparent adhesive layer 101 and the display back plate 200 is increased to a third release force, and the third release force is greater than the second release force.

In S140, a heavy release film is removed, and a functional layer is attached on a side, distal from the display back plate, of the transparent adhesive layer.

For example, the heavy release film 102 is directly released.

Figure 3:
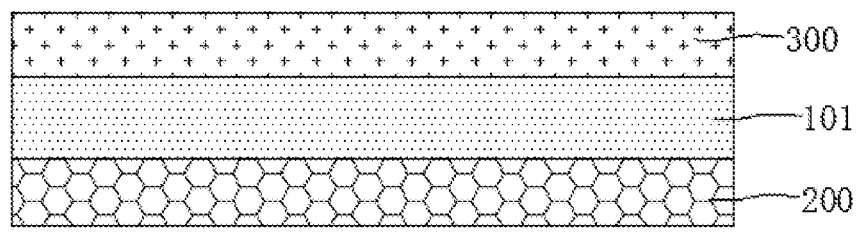
FIG. 3 is a schematic structural diagram of a display panel according to an embodiment of the present disclosure.

FIG. 3 is a schematic structural diagram of a display panel according to an embodiment of the present disclosure. Referring to FIG. 3, the functional layer 300 is attached on the side, distal from the display back plate 200, of the transparent adhesive layer 101.

In the method for manufacturing the display panel according to the present disclosure, the protective film may be attached before testing the display back plate 200 for protecting the display back plate 200. Upon completing of the detection and before performing the attachment of the functional layer 300, a technical solution, where the protective film is removed and the functional layer is adhered by an optical adhesive layer, is not applied, but the transparent adhesive layer 101 in the protective layer is directly tackified and is further configured to adhere the functional layer 300, thereby avoiding the cost of the material caused by additional optical adhesive layer and reducing the cost of manufacturing the display panel.

The specific processes, principles, and effects of the method for manufacturing the display panel according to the present disclosure are further explained and illustrated in conjunction with the accompanying drawings.

Figure 4:
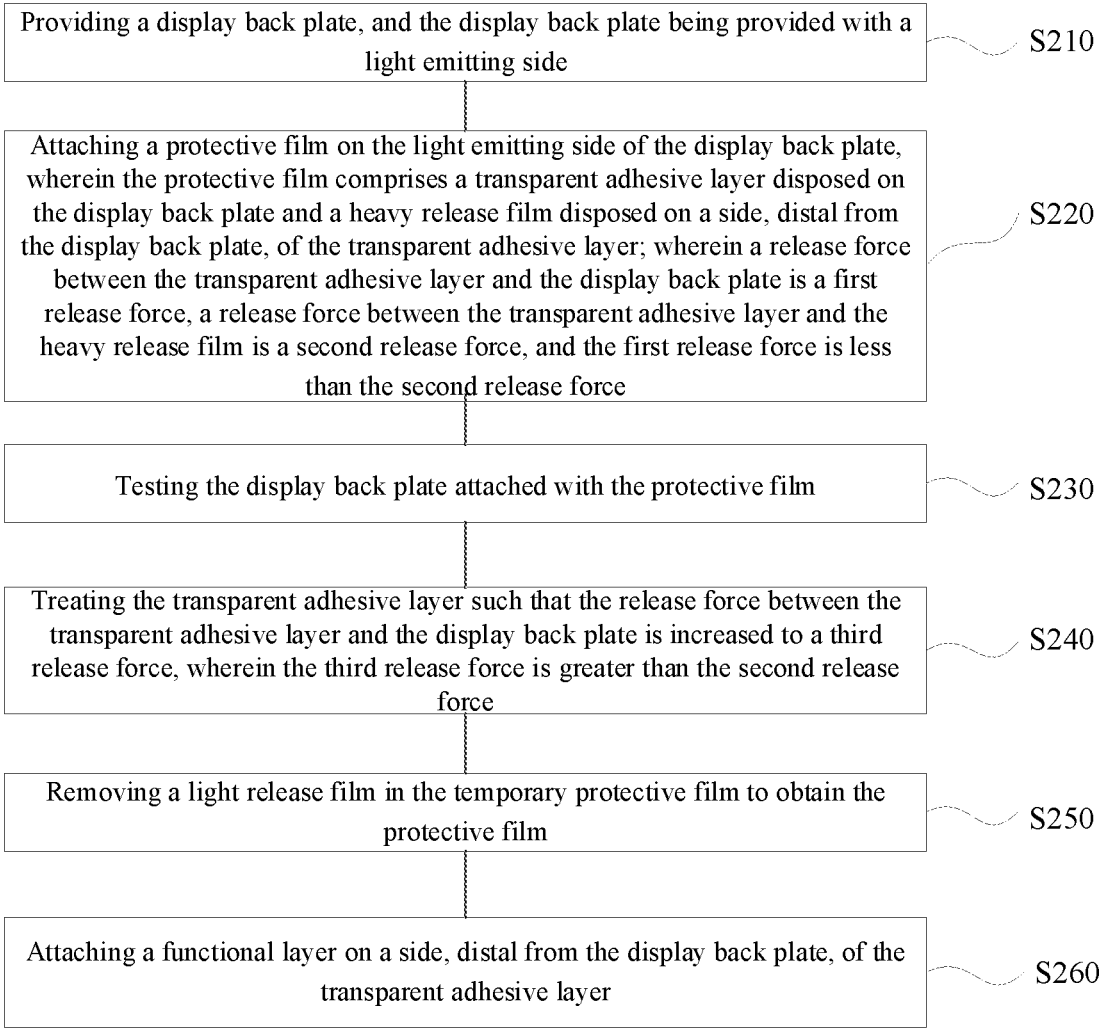
FIG. 4 is a flowchart of a method for manufacturing a display panel according to an embodiment of the present disclosure.

FIG. 4 is a flowchart of a method for manufacturing a display panel according to an embodiment of the present disclosure. Referring to FIG. 4, the method includes the following processes S210 to S260.

In S210, a display back plate is provided. The display back plate 200 is the intermediate product of the displays panel. In some embodiments, the display back plate 200 may be an intermediate product of a display panel before performing a lighting detection.

In some embodiments, the display back plate 200 according to the present disclosure may be one of an organic light-emitting diode (OLED) display back plate, a quantum dot organic light-emitting diode (QD-OLED) display back plate, a micro Light-emitting diode (Micro LED) display back plate, a liquid crystal display (LCD) display back plate, or other type of display back plate.

Hereinafter, a structure of the display back plate 200 is described and illustrated using the display back plate 200 as an OLED display back plate as an example.

Figure 5:
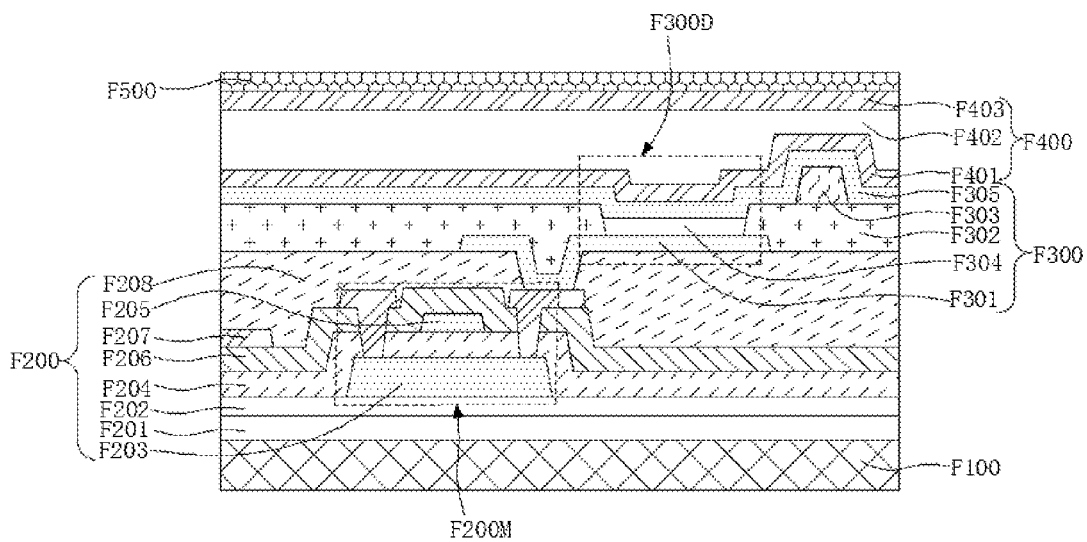
FIG. 5 is a schematic structural diagram of a display back plate according to an embodiment of the present disclosure.

FIG. 5 is a schematic structural diagram of a display back plate according to an embodiment of the present disclosure. Referring to FIG. 5, the display back plate may include a base substrate F100, a drive circuit layer F200, and a pixel layer F300 that are successively laminated.

The base substrate F100 may be a base substrate F100 made of an inorganic material, or may be a base substrate F100 made of an organic material. For example, in some embodiments, a material of the base substrate F100 may be a glass material such as a soda lime glass, a quartz glass, a sapphire glass, or the like, or may be a metallic material such as a stainless steel, aluminum, nickel, or the like. In some embodiments, the material of the base substrate F100 may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN), or a combination thereof. In some embodiments, the base substrate F100 may further be a flexible base substrate F100, for example, the material of the base substrate F100 may be polyimide (PI). The base substrate F100 may further be a composite of a multi-layer material, for example, in some embodiments, the base substrate F100 may include a bottom film layer, a pressure sensitive adhesive layer, a first polyimide layer, and a second polyimide layer that are successively laminated.

In some embodiments, in the drive circuit layer F200, any one of the pixel drive circuits may include a transistor F200M and a storage capacitor. Furthermore, the transistor F200M may be a thin film transistor, and the thin film transistor may be a top-gate thin film transistor, a bottom-gate thin film transistor, or a double-gate thin film transistor; a material of an active layer of the thin film transistor may be an amorphous silicon semiconductor material, a low temperature polycrystalline silicon semiconductor material, a metal oxide semiconductor material, an organic semiconductor material, or other type of semiconductor material; the thin film transistor may be an N-type thin film transistor or a P-type thin film transistor. In some embodiments, the thin film transistor is a low temperature polysilicon transistor.

It should be understood that types of any two of the transistors in the pixel drive circuit may or may not be the same. Illustratively, in some embodiments, in one pixel drive circuit, part of the transistors may be N-type transistors and other part of the transistors may be P-type transistors. Illustratively, in some embodiments, in one pixel drive circuit, the material of the active layer of part of the transistor may be the low temperature polysilicon semiconductor material, and the material of the active layer of other part of the transistors may be the metal oxide semiconductor material.

In some embodiments, the drive circuit layer F200 may include a semiconductor layer F203, a gate insulating layer F204, a gate layer F205, an interlayer dielectric layer F206, and a source drain metal layer F207 that are laminated between the base substrate F100 and the pixel layer F300. The thin film transistor and the storage capacitor may be formed from the semiconductor layer F203, the gate insulating layer F204, the gate layer F205, the interlayer dielectric layer F206, the source drain metal layer F207, and the like. The positional relationship of the various film layers may be determined according to the film layer structure of the thin film transistor. For example, in some embodiments, the drive circuit layer F200 may include the semiconductor layer F203, the gate insulating layer F204, the gate layer F205, the interlayer dielectric layer F206, and the source drain metal layer F207 that are successively laminated such that the formed thin film transistor is the top-gate thin film transistor. In some embodiments, the drive circuit layer F200 may include the gate layer F205, the gate insulating layer F204, the semiconductor layer F203, the interlayer dielectric layer F206, and the source drain metal layer F207 that are successively laminated such that the formed thin film transistor is the bottom-gate thin film transistor. The drive circuit layer F200 may further employ a dual gate layer F205 structure, that is, the gate layer F205 may include a first gate layer and a second gate layer, the gate insulating layer F204 may include a first gate separating layer configured to isolate the semiconductor layer F203 from the first gate layer, and a second gate insulating layer configured to separate the first gate layer from the second gate layer. For example, in some embodiments, the drive circuit layer F200 may include the semiconductor layer F203, the first gate insulating layer, the first gate layer, the second gate insulating layer, the second gate layer, the interlayer dielectric layer F206, and the source drain metal layer F207 that are sequentially laminated on a side of the base substrate F100.

In some embodiments, the drive circuit layer F200 may further include a passivation layer, and the passivation layer may be disposed on a surface, distal from the base substrate F100, of the source drain metal layer F207 to protect the source drain metal layer F207.

In some embodiments, the drive circuit layer F200 may further include a buffer material layer disposed between the base substrate F100 and the semiconductor layer F203, and both the semiconductor layer F203, the gate layer F205 are disposed on a side, distal from the base substrate F100, of the buffer material layer. A material of the buffer material layer may be an inorganic insulating material such as silicon oxide, silicon nitride, or the like. The buffer material layer may be one layer of inorganic material or may be a plurality of laminated inorganic material layers. Illustratively, in some embodiments, referring to FIG. 5, the buffer material layer may include a barrier layer F201 disposed on a side proximal to the base substrate F100, and a buffer layer F202 disposed on a side, distal from the base substrate F100, of the barrier layer F201. The barrier layer F201 is configured to block a permeation of the ions in the base substrate F100 into the drive circuit layer F200 such that the drive circuit layer F200 maintains the stable performance. The buffer layer F202 may improve an adhesive force between the drive circuit layer F200 and the base substrate F100, and provide a stable environment for the drive circuit layer F200.

In some embodiments, the drive circuit layer F200 may further include a planarization layer F208 disposed between the source drain metal layer F207 and the pixel layer F300, and the planarization layer F208 may provide a planarized surface for a pixel electrode. In some embodiments, a material of the planarization layer F208 may be an organic material.

In some embodiments, the pixel layer F300 may be disposed on a side, distal from the base substrate F100, of the drive circuit layer F200, and the pixel layer F300 may include a pixel electrode layer F301, a pixel definition layer F302, a support pillar layer F303, an organic light emitting functional layer F304, and a common electrode layer F305 that are successively laminated. Herein, the pixel electrode layer F301 is provided with a plurality of pixel electrodes in a display region of the display back plate; the pixel definition layer F302 is provided with a plurality of penetrated pixel openings in the display region that are in one-to-one correspondence with the plurality of pixel electrodes, wherein any one of the pixel openings exposes at least a portion of the region of the corresponding pixel electrode. The support pillar layer F303 includes a plurality of support pillars in the display region, wherein the plurality of support pillars are disposed on a surface, distal from the base substrate F100, of the pixel definition layer F302 to support a fine metal reticle (FMM) in the evaporation process. The organic light emitting functional layer F304 at least covers the pixel electrodes exposed by the pixel definition layer F302. The organic light emitting functional layer F304 may include an organic electroluminescent material layer, and may include one or more of a hole injection layer, a hole transport layer, an electron blocking layer, a hole blocking layer, an electron transport layer, and an electron injection layer. The various film layers of the organic light emitting functional layer F304 may be prepared by an evaporation process, and the patterns of the various film layers may be defined using the fine metal reticle or an open mask in the evaporation process. The common electrode layer F305 may cover the organic light emitting functional layer F304 in the display area. As such, the pixel electrode, the common electrode layer F305, and the organic light emitting functional layer F304 disposed between the pixel electrode and the common electrode layer F305 form an organic electroluminescence diode F300D, and any organic electroluminescence diode may serve as a sub-pixel of the display back plate.

In some embodiments, the pixel layer F300 may further include a light extraction layer on a side, distal from the base substrate F100, of the common electrode layer F305 to increase the light extraction efficiency of the organic light emitting diode.

In some embodiments, the display back plate may further include a thin film encapsulation layer F400. The thin film encapsulation layer F400 is disposed on a surface, distal from the base substrate F100, of the pixel layer F300, and may include an inorganic encapsulation layer and an organic encapsulation layer that are in an alternating stack. The inorganic encapsulation layer may effectively block the ambient moisture and oxygen, preventing the material from degrading caused by the water and oxygen intruding into the organic light emitting functional layer F304. In some embodiments, edges of the inorganic encapsulation layer may be disposed in the peripheral region. The organic encapsulation layer is disposed between two adjacent inorganic encapsulation layer to achieve planarization and reduce stress between the inorganic encapsulation layers. Edges of the organic encapsulation layer may be disposed between the display region and the edges of the inorganic encapsulation layer. Illustratively, the thin film encapsulation layer F400 includes a first inorganic encapsulation layer F401, an organic encapsulation layer F402, and a second inorganic encapsulation layer F403 that are sequentially laminated on a side, distal from the base substrate F100, of the pixel layer F300.

In some embodiments, the display back plate may further include a touch functional layer F500 disposed on a side, distal from the base substrate F100, of the thin film encapsulation layer F400 to achieve a touch operation of the display back plate.

Furthermore, the touch functional layer may employ a flexible multi-layer on-cell (FMLOC) technique that includes a plurality of flexible layers sequentially laminated on the thin-film encapsulation layer, at least one metal layer of the plurality of flexible layers forms a touch electrode.

The display back plate 200 can emit light to display, and a side where the light emits is a light emitting side of the display panel. Illustratively, in some embodiments, the display back plate 200 includes the base substrate F100, the drive circuit layer F200, the pixel layer F300, and the thin film encapsulation layer F400 that are laminated, the light emitted by the pixel layer F300 passes through the thin film encapsulation layer F400 to realize display, a side, distal from the base substrate, of the thin film encapsulation layer F400 is the light emitting side of the display back plate 200.

In S220, a protective film is attached on a light emitting side of the display back plate.

The protective film may include the transparent adhesive layer 101 for adhering to the display back plate 200 and the heavy release film 102 disposed on a side, distal from the display back plate 200, of the transparent adhesive layer 101. As such, a surface of the light emitting side of the display back plate 200 is covered and protected by the protective film.

Figure 6:
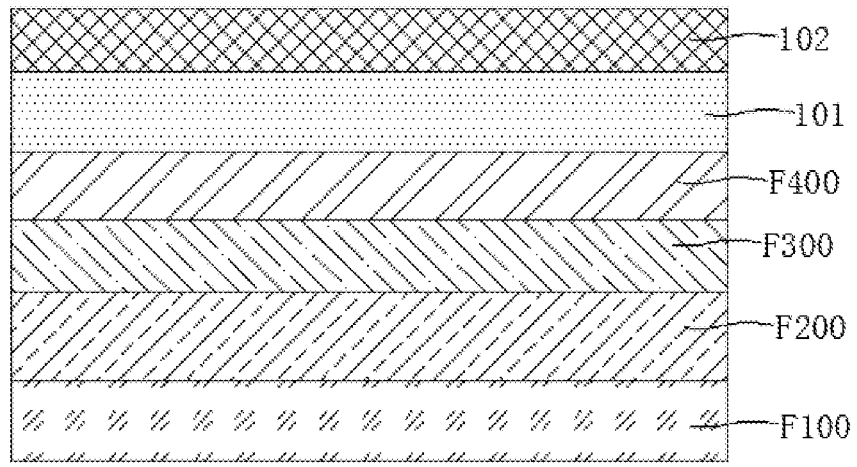
FIG. 6 is a schematic structural diagram of a display back plate attached with a protective film according to an embodiment of the present disclosure.

In some embodiments, FIG. 6 is a schematic structural diagram of a display back plate attached with a protective film according to an embodiment of the present disclosure. Referring to FIG. 6, the display plate 200 includes the base substrate F100, the drive circuit layer F200, the pixel layer F300, and the thin film encapsulation layer F400 that are successively laminated. In S220, the protective film may be attached to a surface, distal from the base substrate, of the thin film encapsulation layer F400.

Figure 7:
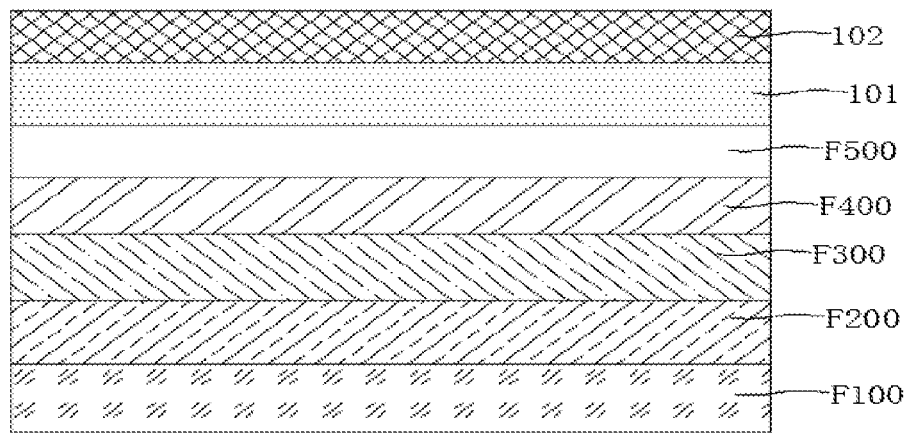
FIG. 7 is a schematic structural diagram of a display back plate attached with a protective film according to an embodiment of the present disclosure.

In some embodiments, FIG. 7 is a schematic structural diagram of a display back plate attached with a protective film according to an embodiment of the present disclosure. Referring to FIG. 7, the display plate 200 includes the base substrate F100, the drive circuit layer F200, the pixel layer F300, the thin film encapsulation layer F400, and the touch functional layer F500 that are successively laminated. In S220, the protective film may be attached to a surface, distal from the base substrate, of the touch functional layer F500.

It should be understood that in the case that the display plate 200 is other film layer structure, the protective film may be attached to a first layer film layer of the light emitting side of the display back plate 200 to achieve protection of the display back plate 200.

Figure 8:
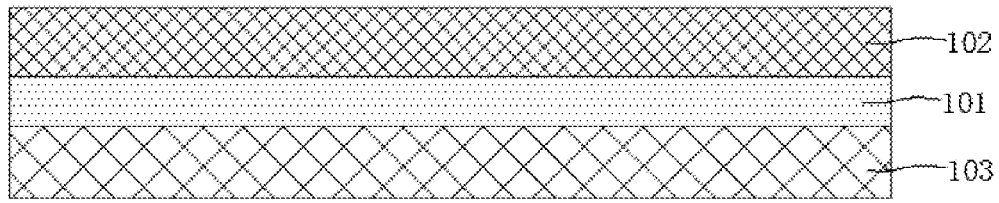
FIG. 8 is a schematic structural diagram of a protective film provided with a light release film according to an embodiment of the present disclosure.

FIG. 8 is a schematic structural diagram of a protective film provided with a light release film according to an embodiment of the present disclosure. In some embodiments, referring to FIG. 8, a protective film including the light release film 103 is firstly provided, and the protective film including the light release film 103 includes the light release film 103, the transparent adhesive layer 101, and the heavy release film 102 that are successively laminated. A fourth release force between the light release film 103 and the transparent adhesive layer 101 is less than the first release force between the transparent adhesive layer 101 and the heavy release film 102. Then, the light release film 103 in the protective film including the light release film 103 may be removed, and the protective film is attached to the display back plate 200.

Illustratively, the fourth release force is not greater than 5 gf/25 mm to facilitate release of the light release film 103.

In some embodiments, the release force between the light release film 103 and the transparent adhesive layer 101 may be less than 5 gf/25 mm such that the light release film 103 may be easily removed.

In the method for manufacturing the display panel according to the present disclosure, the release force between the transparent adhesive layer 101 and the display back plate 200 is the first release force; the release force between the transparent adhesive layer 101 and the heavy release film 102 is the second release force; and the first release force is less than the second release force. As such, the protective film is easily adjusted, for example, bubbles between the protective film and the display back plate 200 are easily eliminated.

In some embodiments, the second release force may be ten times more than the first release force. As such, delamination of the heavy release layer may be prevented in the case that the protective film is adjusted.

In some embodiments, the first release force ranges from 0.8 gf/25 mm to 2 gf/25 mm. As such, a low viscosity adhesive state between the protective film and the display back plate 200 may facilitate elimination of the bubbles between the protective film and the display back plate 200. Furthermore, the first release force ranges from 0.9 gf/25 mm to 1.1 gf/25 mm. Illustratively, in some embodiments, the first release force is 1 gf/25 mm.

In some embodiments, the second release force ranges from 10 gf/25 mm to 20 gf/25 mm, which facilitates the removal of the light release film 103 and the attachment of the protective film, avoiding delamination between the heavy release film 102 and the transparent adhesive layer 101 in the process of the removal of the light release film 103 and the attachment of the protective film. Furthermore, the second release force is not sufficiently great, which facilitates release of the heavy release film 102 in S250, and avoids delamination of the film layers on the display back plate 200 in the process of releasing the heavy release film 102.

Furthermore, the second release force ranges from 13 gf/25 mm to 17 gf/25 mm. Illustratively, in some embodiments, the second release force is 15 gf/25 mm.

In some embodiments, the transparent adhesive layer 101 includes one or more of polymethyl methacrylate, polyimide, epoxy, polyurethane. It should be understood that an additive is added to the transparent adhesive layer 101 to adjust the viscosity of the transparent adhesive layer 101 and the viscosity change of the transparent adhesive layer 101 under external treatment.

In some embodiments, the material of the transparent adhesive layer 101 is a material that viscosity is increased under external treatment, particularly, is a material that the release force between the transparent adhesive layer 101 and the display back plate 200 is increased under external treatment. The external treatment may be one or both of heating, light irradiation, and the like. Illustratively, in some embodiments, the external treatment may be ultraviolet light irradiation.

In some embodiments, a thickness of the transparent adhesive layer 101 ranges from 50 μm to 100 μm, for example, may be 75 μm. It should be understood that the transparent adhesive layer 101 may further be other thicknesses, such as may be less than 50 µm or greater than 100 µm, which depends on the technology requirements of the display panel.

In some embodiments, the heavy release film 102 is a transparent film to facilitate testing the display back plate 200 in S230. Furthermore, the material of the heavy release film 102 may include polyethylene terephthalate (PET).

In some embodiments, the material of the light release film 103 may include polyethylene terephthalate.

It should be understood that by adding a modifier in the polyethylene terephthalate or modifying the surface of the release film, the release force between the release film and the transparent adhesive layer 101 may be different. Herein, in the release films on both sides of the transparent adhesive layer 101, a release film, with a small release force from the transparent adhesive layer 101, is the light releasing film 103, and a release film, with a greater release force from the transparent adhesive layer 101, is the release film 102.

In S230, the display back plate attached with the protective film is tested.

The tests may include a parsing process for failure such as an exploratory test (ET), for example illuminating pixel test, testing whether there is a short or open circuit, testing whether cracks are present, or the like.

In some embodiments, S230 may further include sorting the test performance of the display back plate 200 upon testing the display back plate 200.

In some embodiments, in S210, a display motherboard may be provided. The display motherboard includes a plurality of display back plates 200, and the dimensions of the plurality of display back plates 200 may or may not be the same. In S220, the protective film may be attached on the display motherboard such that the protective film covers the plurality of display back plates 200 on the display motherboard. In S230, the display motherboard may be diced to obtain the display back plate 200 attached with the protective film. The display back plates 200 are then tested.

It should be understood that in S230, other tests or other procedures may be performed, which are performed prior to S240.

In S240, a transparent adhesive layer is treated such that a release force between the transparent adhesive layer and the display back plate is increased to a third release force, and the third release force is greater than the second release force. The treatment on the transparent adhesive layer 101 is performed such that the transparent adhesive layer 101 may increase the release force between the display back plate 200 in response to the treatment.

In some embodiments, the treatment on the transparent adhesive layer 101 may include irradiating the transparent adhesive layer 101 with ultraviolet light. It should be understood that the release force between the treated transparent adhesive layer 101 and the display back plate 200 may be adjusted by adjusting the time or light intensity of the ultraviolet irradiation.

In the method for manufacturing the display panel according to the present disclosure, the release force between the transparent adhesive layer 101 and the display back plate 200 is increased to the third release force upon the transparent adhesive layer 101 is treated; the third release force is greater than the second release force. As such, the heavy release film 102 may be easily removed in S250.

In some embodiments, the third release force is not less than 400 gf/25 mm. In some embodiments, the third release force is not less than 500 gf/25 mm.

In S250, a light release film in a temporary protective film is removed to obtain a protective film.

Furthermore, the heavy release film 102 may be released.

In S260, a functional layer is attached on a surface, distal from the display back plate, of the transparent adhesive layer.

As such, with respect to the related art, the protective film in the present disclosure may be used both as a temporary protective film and as an optical adhesive layer of the adhesive functional layer 300.

In S260, the functional layer 300 may be any film layer that is adhered to the transparent adhesive layer 101, such as a de-reflectivity layer that may reduce reflectivity to ambient light, a transparent protective layer that protects the display panel, and the like. However, other functional film layers may also be used as the functional layer 300.

For example, in some embodiments, a color film sheet or a polarizer may be adhered to a side, distal from the display back plate 200, of the transparent adhesive layer 101 as the de-reflectivity layer. The color film sheet may be a transparent film with a color resistance unit and a black matrix.

For example, in some embodiments, the transparent cover plate may be adhered to a side, distal from the display back plate 200, of the transparent adhesive layer 101 as the transparent protective layer, and the transparent cover plate may be a cover plate made of an organic material or an inorganic material.

The embodiments of the present disclosure further provide a display panel, and the display panel is any display panel manufacturing by the above method for manufacturing the display panel. The display panel includes a display back plate 200, a transparent adhesive layer 101, and a functional layer 300 that are successively laminated according to the above method for manufacturing the display panel.

Furthermore, in some embodiments, a release force between the display back plate 200 and the transparent adhesive layer 101 is not less than 400 gf/25 mm.

The display panel of the present disclosure may be manufacturing by the above manufacturing method such that a protective film is employed to replace a temporary protective film and an optical adhesive layer to achieve the purpose of saving materials, which has lower production costs.

An embodiment of the present disclosure further provides a display device. The display device includes the display panel and a power supply. The power supply is configured to supply power to the display panel. The display panel includes the display back plate, the transparent adhesive layer, and the functional layer that are successively laminated.

In some embodiments, the release force between the display back plate and the transparent adhesive layer is not less than 400 gf/25 mm.

It should be noted that, although the various processes of the method in the present disclosure are described in the accompanying drawings in a particular order, it does not require or imply that these processes need to be performed in the particular order, or that all illustrated processes need be performed to achieve desired results. Additionally, in some embodiments, certain processes may be omitted, multiple processes may be combined into one process, and/or one process may be broken down into multiple processes.

Other embodiments of the present disclosure are apparent to those skilled in the art from consideration of the specification and practice of the present disclosure. The present disclosure is intended to cover any variations, uses, or adaptations of the present disclosure following the general principles thereof and including common knowledge or commonly used technical measures which are not disclosed herein. The specification and the embodiments are to be considered as exemplary only, and the true scope and spirit of the present disclosure are indicated by the following claims.

What is claimed is:

1. A method for manufacturing a display panel, comprising:
   providing a display back plate, wherein the display back plate is provided with a light emitting side;
   attaching a protective film on the light emitting side of the display back plate, wherein the protective film comprises a transparent adhesive layer disposed on the display back plate and a heavy release film disposed on a side, distal from the display back plate, of the transparent adhesive layer; wherein a release force between the transparent adhesive layer and the display back plate is a first release force, and a release force between the transparent adhesive layer and the heavy release film is a second release force, the first release force being less than the second release force;
   treating the transparent adhesive layer such that the release force between the transparent adhesive layer and the display back plate is increased to a third release force, wherein the third release force is greater than the second release force; and
   removing the heavy release film, and attaching a functional layer on the side, distal from the display back plate, of the transparent adhesive layer.

2. The method for manufacturing the display panel according to claim 1, wherein attaching the protective film on the light emitting side of the display back plate comprises:
   providing a temporary protective film, wherein the temporary protective film comprises a light release film, the transparent adhesive layer, and the heavy release film that are successively laminated, a release force between the light release film and the transparent adhesive layer being a fourth release force, the fourth release force being greater than the first release force; and
   removing the light release film in the temporary protective film to obtain the protective film;
   attaching the transparent adhesive layer in the protective film on the light emitting side of the display back plate.

3. The method for manufacturing the display panel according to claim 2, wherein the fourth release force is not greater than 5 gf/25 mm.

4. The method for manufacturing the display panel according to claim 2, wherein the light release film comprises a polyethylene terephthalate film.

5. The method for manufacturing the display panel according to claim 1, wherein the first release force ranges from 0.8 gf/25 mm to 2 gf/25 mm.

6. The method for manufacturing the display panel according to claim 1, wherein the second release force ranges from 10 gf/25 mm to 20 gf/25 mm.

7. The method for manufacturing the display panel according to claim 1, wherein the third release force is not less than 400 gf/25 mm.

8. The method for manufacturing the display panel according to claim 1, wherein treating the transparent adhesive layer comprises:
   irradiating the transparent adhesive layer with ultraviolet light.

9. The method for manufacturing the display panel according to claim 1, wherein a material of the transparent adhesive layer comprises at least one of polymethyl methacrylate, polyimide, epoxy, or polyurethane.

10. The method for manufacturing the display panel according to claim 1, wherein the heavy release film comprises a polyethylene terephthalate film.

11. The method for manufacturing the display panel according to claim 1, wherein
    the display back plate comprises a base substrate, a drive circuit layer, a pixel layer, and a thin film encapsulation layer that are successively laminated; and
    attaching the protective film on the light emitting side of the display back plate comprises:
        attaching the protective film on a surface, distal from the base substrate, of the thin film encapsulation layer.

12. The method for manufacturing the display panel according to claim 1, wherein
    the display back plate comprises a base substrate, a drive circuit layer, a pixel layer, a thin film encapsulation layer, and a touch functional layer that are successively laminated; and
    attaching the protective film on the light emitting side of the display back plate comprises:
        attaching the protective film on a surface, distal from the base substrate, of the touch functional layer.

13. The method for manufacturing the display panel according to claim 1, wherein the functional layer is a de-reflectivity layer or a transparent protective layer.

14. The method for manufacturing the display panel according to claim 1, wherein upon attaching the protective film on the light emitting side of the display back plate, and prior to treating the transparent adhesive layer, the method further comprises:
    testing the display back plate attached with the protective film.

* * * * *